(12) United States Patent
Wang

(10) Patent No.: US 8,151,415 B2
(45) Date of Patent: Apr. 10, 2012

(54) HINGE ASSEMBLY

(75) Inventor: Jin-Xin Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 399 days.

(21) Appl. No.: 12/431,870

(22) Filed: Apr. 29, 2009

(65) Prior Publication Data
US 2010/0071162 A1 Mar. 25, 2010

(30) Foreign Application Priority Data

Sep. 22, 2008 (CN) .......................... 2008 1 0304601

(51) Int. Cl.
*E05D 11/10* (2006.01)

(52) U.S. Cl. .............................. 16/344; 16/307; 16/386

(58) Field of Classification Search .................. 16/344, 16/285, 296, 299, 300, 303, 328, 329, 337–340, 16/193; 361/679.27; 411/923
See application file for complete search history.

(56) References Cited

U.S. PATENT DOCUMENTS

| | | | | |
|---|---|---|---|---|
| 4,345,848 A * | 8/1982 | Cheselka | ...................... | 403/157 |
| 6,038,739 A * | 3/2000 | Katoh | .............. | 16/342 |
| 7,082,642 B2 * | 8/2006 | Su | .................. | 16/340 |
| 7,243,397 B2 * | 7/2007 | Cho et al. | ........................ | 16/340 |
| 7,430,786 B1 * | 10/2008 | Jian | .................. | 16/330 |
| 7,430,829 B2 * | 10/2008 | Murello | .......................... | 42/124 |
| 7,870,644 B2 * | 1/2011 | Chang | ............................. | 16/337 |
| 2004/0078931 A1 * | 4/2004 | Krozek | .............................. | 16/303 |
| 2007/0261204 A1 * | 11/2007 | Lu et al. | ........................ | 16/340 |
| 2008/0256749 A1 * | 10/2008 | Jian | .................. | 16/321 |
| 2009/0320243 A1 * | 12/2009 | Wang et al. | ..................... | 16/303 |

FOREIGN PATENT DOCUMENTS

CN 2831706 Y 10/2006

\* cited by examiner

*Primary Examiner* — Victor Batson
*Assistant Examiner* — Matthew Sullivan
(74) *Attorney, Agent, or Firm* — Altis Law Group, Inc.

(57) ABSTRACT

A hinge assembly includes a stationary member, a rotating member, and a pivotal shaft. The stationary member forms a position protrusion. The rotating member defines a receiving depression to receive the position protrusion. The pivotal shaft includes an elastic portion. The stationary member and the rotating member are positioned on the pivotal shaft such that the position protrusion is received in the receiving depression. The rotating member is non-rotatable relative to the pivotal shaft. The stationary member is rotatable relative to the pivotal shaft. The elastic portion deforms to push the rotating member to firmly engage the stationary member.

14 Claims, 4 Drawing Sheets

HINGE ASSEMBLY

BACKGROUND

1. Technical Field

The present disclosure relates to a hinge assembly employed in an electronic device.

2. Description of the Related Art

A portable electronic device generally includes a cover, a main body, and a hinge assembly rotatably connecting the cover to the main body.

The hinge assembly includes a supporting member, a connecting member, a pivotal shaft, a stationary member, a rotating member, a plurality of elastic members, a frictional washer, and a screw nut.

To open or close the cover, an external force is applied on the cover to rotate the cover. The pivotal shaft and the connecting member rotate and drive the rotating member to rotate relative to the stationary member. The elastic members provide an axial force such that the rotating member abuts the stationary member. As a result, the cover remains in a desired position due to a friction force between the rotating member and the stationary member.

Generally, the elastic members are compression spring. Therefore, a protecting washer is needed to protect the elastic members. A protecting washer increases the number of the components in the hinge assembly, thereby increasing assembly cost.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure.

DETAILED DESCRIPTION

Figure 1:
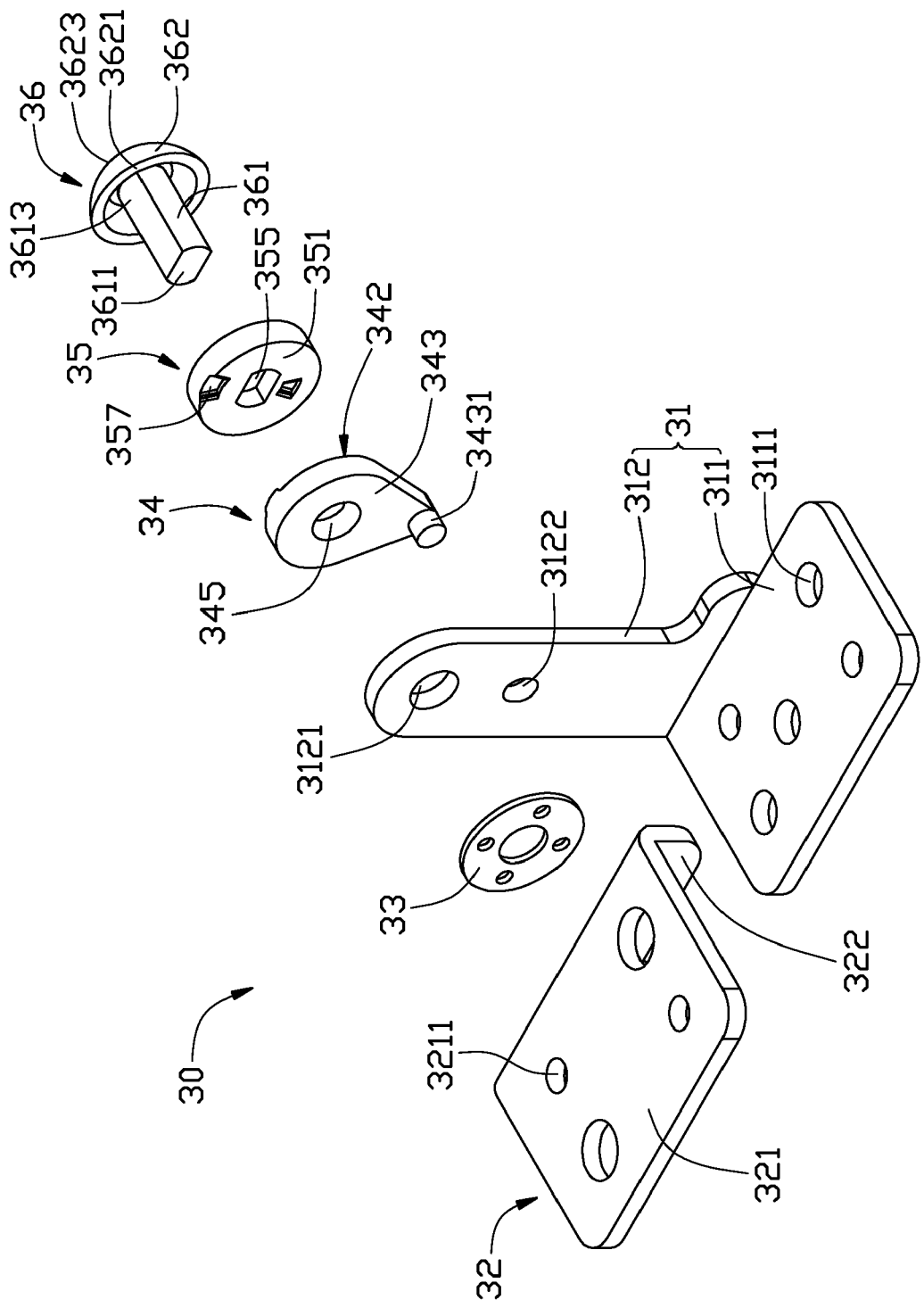
FIG. 1 is an exploded, isometric view of an embodiment of a hinge assembly.
Figure 2:
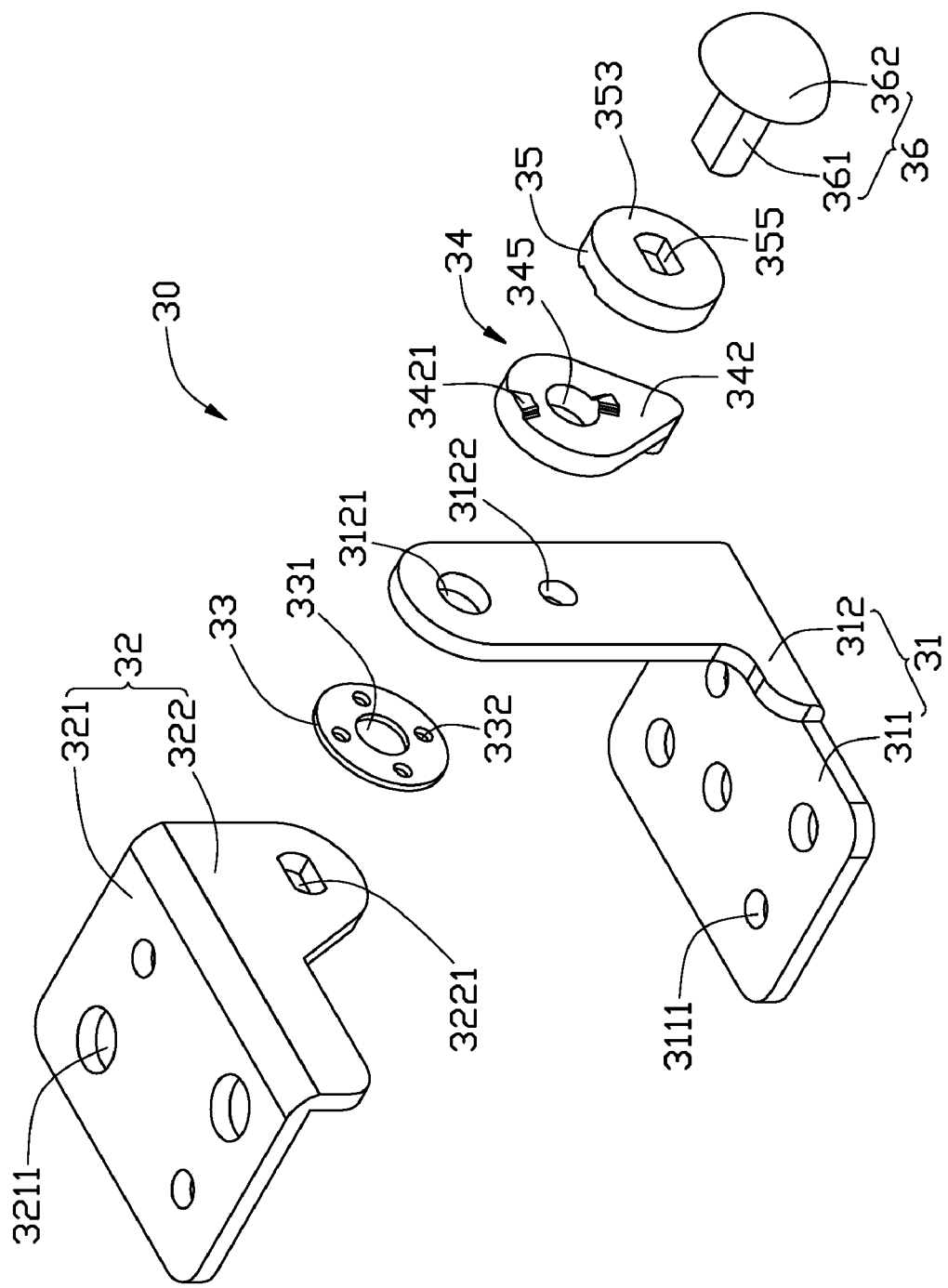
FIG. 2 is similar to FIG. 1, but showing a view from another aspect.

Referring to FIGS. 1 and 2, a hinge assembly 30 includes a supporting member 31, a connecting member 32, a frictional washer 33, a stationary member 34, a rotating member 35, and a pivotal shaft 36.

The supporting member 31 includes a base portion 311 and a supporting portion 312. The base portion 311 and the supporting portion 312 cooperatively form a substantially L-shaped structure. The base portion 311 defines a plurality of mounting holes 3111 such that the supporting member 31 is able to be fixed on a main body (not shown) of an electronic device (not shown). The supporting portion 312 defines a circular pivot hole 3121 to receive the pivotal shaft 36 and a position hole 3122 adjacent to the pivot hole 3121.

The connecting member 32 includes an assembly portion 321 and a connecting portion 322 extending from a periphery of the assembly portion 321. The assembly portion 321 defines a plurality of assembly holes 3211 such that the connecting member 32 is able to be fixed on a cover (not shown) of the electronic device. The connecting portion 322 defines a non-circular hole 3221 (FIG. 2) to receive the pivotal shaft 36.

The frictional washer 33 defines a circular pivot hole 331 in a center and a plurality of oil holes 332 adjacent to the pivot hole 331. Lubricant stored in the oil holes 332 can enter a space defined by the connecting portion 322 and the supporting portion 312 to reduce abrasion.

The stationary member 34 includes an engaging surface 342 and a resisting surface 343 opposite to the engaging surface 342. The stationary member 34 defines a circular pivot hole 345 through the engaging surface 342 and the resisting surface 343. The stationary member 34 forms two position protrusions 3421 on the engaging surface 342 and a locking protrusion 3431 on the resisting surface 343. The locking protrusion 3431 may be received in the position hole 3122 such that the stationary member 34 is non-rotatable relative to the connecting member 32.

The rotating member 35 includes a receiving surface 351 and a position surface 353 opposite to the receiving surface 351. The rotating member 35 defines a non-circular hole 355 in a center of the rotating member 35 and two receiving depressions 357 adjacent to the non-circular hole 355. The position protrusions 3421 are receivable in the receiving depressions 357.

The pivotal shaft 36 can be made of amorphous alloy. The pivotal shaft 36 includes a shaft portion 361 and an elastic portion 362. The shaft portion 361 includes a first end 3611 and a second end 3613 opposite to the first end 3611. The elastic portion 362 is integrally formed with the shaft portion 361 on the second end 3613. In the illustrated embodiment, the elastic portion 362 is hemispherical and surrounds the second end 3613 of the shaft portion 361. The elastic portion 362 includes a top 3623 and a bottom 3621 opposite to the top 3623 (see FIG. 1). The top 3623 of the elastic portion 362 is integrally formed on the distal end of the second end 3613, and the bottom 3621 of the elastic portion 362 faces the first end 3611 for providing an axial force along the shaft portion 361. The shaft portion 361 is flat along a section of a cylindrical surface area thereof, thus forming a flat surface (not labeled), thereby forming a shaft portion (not labeled) corresponding in shape to the non-circular hole 355 of the rotating member 35.

Since the pivotal shaft 36 is made of amorphous alloy, the elastic portion 362 is elastic and has enough mechanical strength. Alternatively, the shaft portion 361 can be made of other elastic material such as spring steel.

Figure 3:
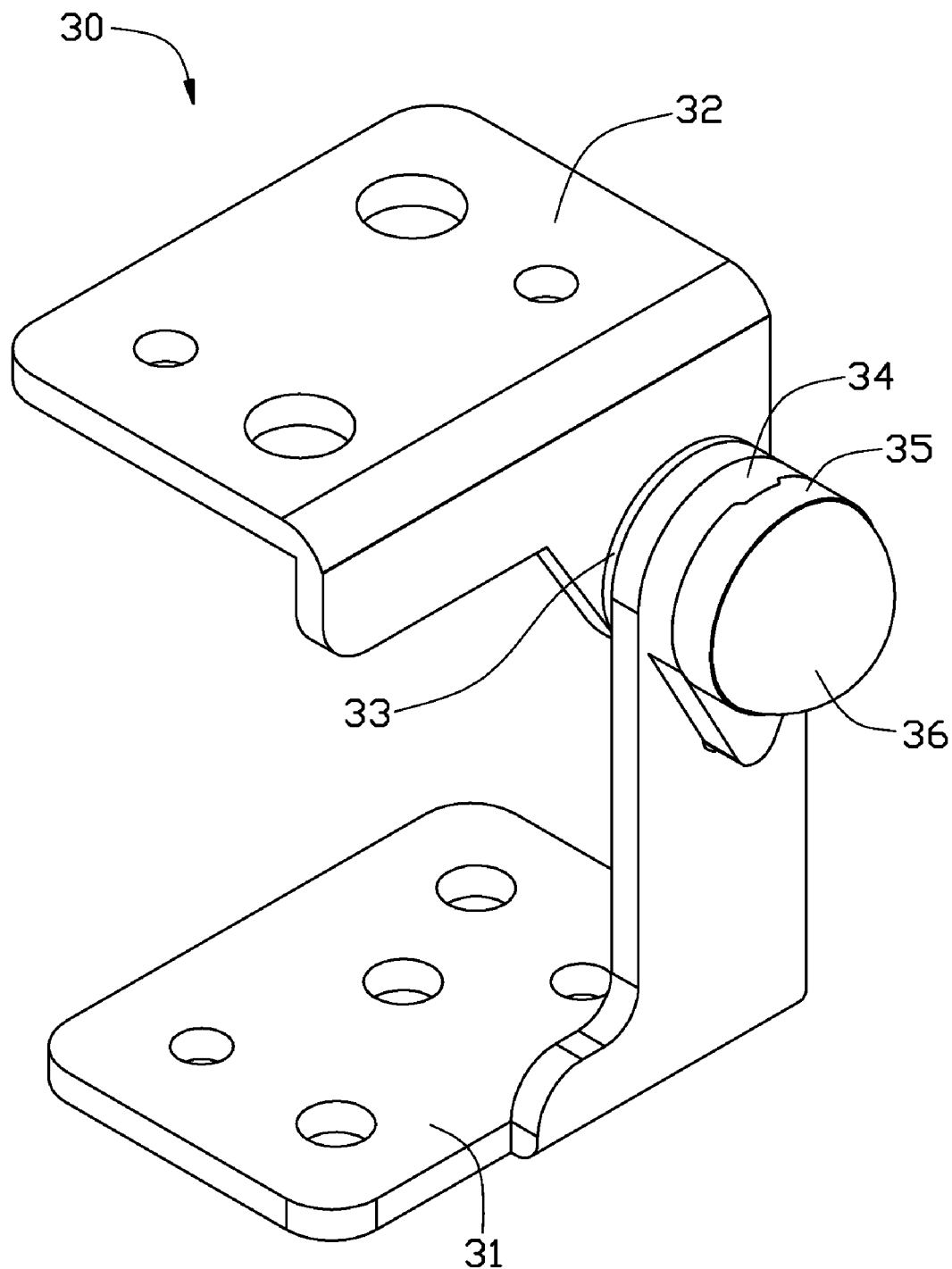
FIG. 3 is an isometric view of the hinge assembly in FIG. 1 after assembled.
Figure 4:
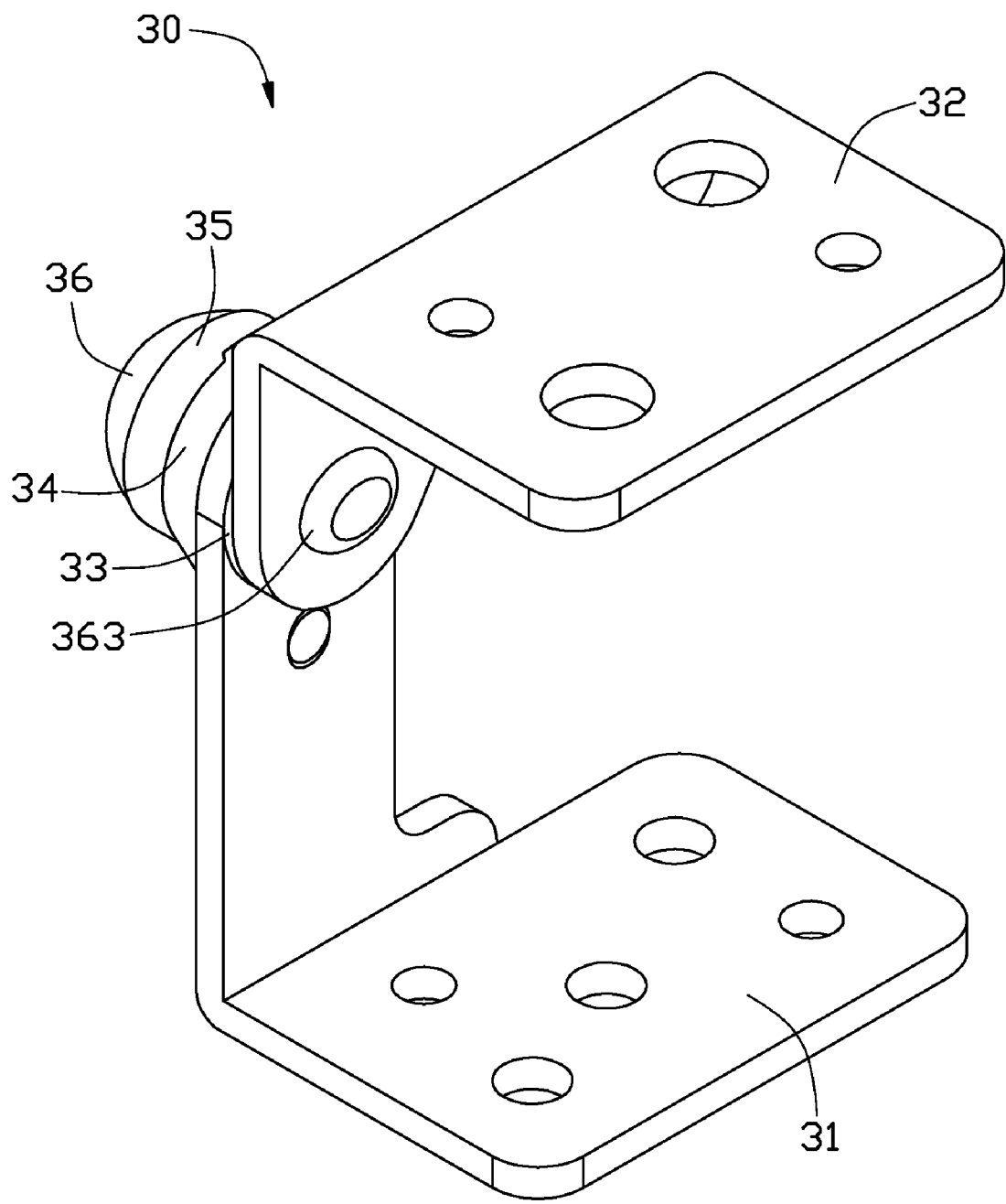
FIG. 4 is similar to FIG. 3, but showing a view from another aspect.

Referring to FIGS. 3 and 4, to assemble the hinge assembly 30, the locking protrusion 3431 is inserted into the position hole 3122 such that the stationary member 34 is non-rotatable relative to the connecting member 32. The first end 3611 is inserted through the non-circular hole 355, the circular pivot hole 345, the circular pivot hole 3121, the circular pivot hole 331, and the non-circular hole 3221, and the position protrusions 3421 are received in the receiving depressions 357. After that, the first end 3611 is deformed to form a locking member 363 to prevent the supporting member 31, the connecting member 32, the frictional washer 33, the stationary member 34, and the rotating member 35 from detaching from each other.

To assemble the hinge assembly 30 on the electronic device, the connecting member 32 is fixed on the cover, and the supporting member 31 is fixed on the main body. Thus, the cover and the rotating member 35 are non-rotatable relative to the pivotal shaft 36, and the main body and the stationary member 34 are rotatable relative to the pivotal shaft 36.

To open or close the cover, an external force is applied to rotate the cover, the cover drives the connecting member 32 to follow the rotation, then the connecting member 32 drives the pivotal shaft 36 to rotate, the pivotal shaft 36 drives the rotating member 35 to rotate. Simultaneously, the elastic portion 362 is deformed and provides an axial force to push the rotating member 35 to firmly engage with stationary member 34. Thus, the cover remains in a desired position due to a friction force between the rotating member and the stationary member.

It should be pointed out that, since the elastic portion 362 provides axial force, there is no need for an extra elastic member, and a length of the shaft portion 361 can be reduced. In addition, the elastic portion 362 also has a function to prevent the components such as rotating member 35 from detaching from each other. As a result, a number of the components is reduced, that facilitate to assemble.

It can be understood that, the position protrusions 3421 may be formed on the receiving surface 351, the receiving depressions 357 may be defined in the engaging surface 342. In addition, the supporting member 31 and the connecting member 32 may be omitted, the stationary member 34 may be directly fixed on the main body, and the rotating member 35 may be directly fixed on the cover.

Finally, while various embodiments have been described and illustrated, the embodiments are not to be construed as being limited thereto. Various modifications can be made to the embodiments by those skilled in the art without departing from the true spirit and scope of the embodiments as defined by the appended claims.

What is claimed is:

1. A hinge assembly comprising:
   a stationary member having a position protrusion;
   a rotating member defining a receiving depression to receive the position protrusion; and
   a pivotal shaft comprising a shaft portion and an elastic portion integrally formed with the shaft portion, the shaft portion having a first end and an opposite second end, the elastic portion being hemispherical and having a top integrally formed on the second end of the shaft portion and an opposite bottom facing toward the first end and surrounding the shaft portion; wherein the pivotal shaft is made of amorphous alloy, the stationary member and the rotating member are positioned on the pivotal shaft from the first end, the position protrusion is received in the receiving depression; the rotating member is non-rotatable relative to the pivotal shaft, and the stationary member is rotatable relative to the pivotal shaft; the bottom of the elastic portion axially resisting against the rotating member thereby providing an axial force pushing the rotating member to firmly engage with the stationary member.

2. The hinge assembly of claim 1, further comprising a locking member, wherein the locking member is formed by deforming the first end of the pivotal shaft.

3. The hinge assembly of claim 1, further comprising a supporting member rotatably positioned on the pivotal shaft, wherein the stationary member is fixed on the supporting member.

4. The hinge assembly of claim 3, wherein the supporting member comprises a base portion and a supporting portion, the base portion and the supporting portion cooperatively form a substantially L-shaped structure, and the stationary member is fixed on the supporting portion.

5. The hinge assembly of claim 4, wherein the base portion defines a plurality of assembly holes.

6. The hinge assembly of claim 4, wherein the supporting portion defines a circular pivot hole to receive the pivotal shaft and a position hole adjacent to the pivot hole; the stationary member comprises an engaging surface and a resisting surface opposite to the engaging surface, and the stationary member defines a circular pivot hole, the position protrusion is on the engaging surface, the stationary member forms a locking protrusion on the resisting surface, the locking protrusion is received in the position hole such that the stationary member is non-rotatable relative to the connecting member.

7. The hinge assembly of claim 3, further comprising a connecting member, wherein the connecting member is non-rotatably positioned on the pivotal shaft.

8. The hinge assembly of claim 7, further comprising a frictional washer, wherein the frictional washer includes a plurality of oil holes, and the frictional washer is positioned on the pivotal shaft and between the connecting member and the supporting member.

9. A hinge assembly comprising:
   a supporting member;
   a connecting member positioned adjacent to a first side of the supporting member;
   a stationary member fixed on a second side of the supporting member opposite to the first side, the stationary member having a position protrusion;
   a rotating member defining a receiving depression corresponding to the position protrusion; and
   a pivotal shaft comprising a shaft portion and an elastic portion integrally formed with the shaft portion; the shaft portion having a first end and an opposite second end, the elastic portion being hemispherical and having a top integrally formed on the second end of the shaft portion and an opposite bottom facing toward the first end and surrounding the shaft portion; wherein the pivotal shaft is made of amorphous alloy, the supporting member, the connecting member, the stationary member, and the rotating member are positioned on the pivotal shaft from the first end, the position protrusion is received in the receiving depression; the rotating member and the connecting member are non-rotatable relative to the pivotal shaft, and the supporting member and the stationary member are rotatable relative to the pivotal shaft; the bottom of the elastic portion axially resisting against the rotating member thereby providing an axial force pushing the rotating member to firmly engage with the stationary member.

10. The hinge assembly of claim 9, further comprising a locking member, wherein the locking member is formed by deforming the first end of the pivotal shaft.

11. The hinge assembly of claim 9, wherein the supporting member comprises a base portion and a supporting portion, the base portion and the supporting portion cooperatively form a substantially L-shaped structure, and the stationary member is fixed on the supporting portion.

12. The hinge assembly of claim 11, wherein the base portion defines a plurality of assembly holes.

13. The hinge assembly of claim 11, wherein the supporting portion defines a circular pivot hole to receive the pivotal shaft and a position hole adjacent to the pivot hole; the stationary member comprises an engaging surface and a resisting surface opposite to the engaging surface, and the stationary member defines a circular pivot hole, the position protrusion is on the engaging surface, the stationary member forms a locking protrusion on the resisting surface, the locking protrusion is received in the position hole such that the stationary member is non-rotatable relative to the connecting member.

14. The hinge assembly of claim 13, further comprising a frictional washer, wherein the frictional washer includes a plurality of oil holes, and the frictional washer is positioned on the pivotal shaft and between the connecting member and the supporting member.

* * * * *